(12) United States Patent
Freitag et al.

(10) Patent No.: US 12,640,332 B2
(45) Date of Patent: May 26, 2026

(54) BLANKER-ENHANCED MOIRE IMAGING

(71) Applicant: FEI Company, Hillsboro, OR (US)

(72) Inventors: Bert Freitag, Eindhoven (NL); Erik Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 438 days.

(21) Appl. No.: 18/472,943

(22) Filed: Sep. 22, 2023

(65) Prior Publication Data

US 2025/0104958 A1      Mar. 27, 2025

(51) Int. Cl.
*H01J 37/04* (2006.01)

(52) U.S. Cl.
CPC ..... *H01J 37/045* (2013.01); *H01J 2237/2611* (2013.01); *H01J 2237/2617* (2013.01); *H01J 2237/2802* (2013.01)

(58) Field of Classification Search
CPC ............ H01J 37/045; H01J 2237/2611; H01J 2237/2617; H01J 2237/2802; H01J 37/28; G01L 1/25; G01N 2223/335; G01N 2223/405; G01N 2223/418; G01N 2223/607; G01N 23/2251; G01N 23/041; G01N 23/04; G01N 23/2202; G01N 23/2204; G01N 2223/306; G01N 2223/401
USPC ................................. 250/306, 307, 310, 311
See application file for complete search history.

(56) References Cited

U.S. PATENT DOCUMENTS

2011/0073757 A1* 3/2011 Tanaka ................. G01N 23/207
250/311

FOREIGN PATENT DOCUMENTS

EP            3379557 A1      9/2018

OTHER PUBLICATIONS

Ishizuka et al., "STEM moiré analysis for 2D strain measurements," Microscopy, 2017, 66, 217-221.
Kim et al., "Scanning moire fringe imaging for quantitative strain mapping in semiconductor devices," Appl. Phys. Lett., 2013, 102.
Su et al., "Scanning moire fringe imaging by scanning transmission electron microscopy," Ultramicroscopy, 2010, 110, 229-233.
European Patent Office. Extended European Search Report for Application No. 24200694.8, dated Feb. 12, 2025 (9 pages).
Xing, Y. M., et al. "Determining interfacial thermal residual stress in SiC/Ti-15-3 composites." Scripta Materialia 48.6 (2003): 701-706.

(Continued)

*Primary Examiner* — Michael Maskell
(74) *Attorney, Agent, or Firm* — Michael Best & Friedrich LLP

(57)            ABSTRACT

In some embodiments, a scientific instrument includes an electron-beam column configured to scan an electron beam across a sample. The electron-beam column includes a beam blanker configured to gate the electron beam in response to a drive signal. The scientific instrument also includes an electron detector configured to measure a flux of transmitted or scattered electrons having interacted with the sample and an electronic controller configured to acquire an image of the sample using values of the flux measured with the electron detector for a plurality of electron-beam scan locations. The electronic controller is further configured to cause the drive signal to have a gating frequency at which the image has a moiré pattern therein.

20 Claims, 8 Drawing Sheets

(56) References Cited

OTHER PUBLICATIONS

Kim, S., et al. "Scanning moiré fringe imaging for quantitative strain mapping in semiconductor devices." Applied Physics Letters 102.16 (2013) 161604.

Kim et al., "Strained hetero interfaces in Si/SiGe/SiGE/SiGe multi-layers studied by scanning moiré fringe imaging," Journal of Applied Physics, 2013, vol. 114, Issue 5 (5 pages).

* cited by examiner

600

START

602 — ORIENT SAMPLE S WITH RESPECT TO PROBE AND SELECTED SCAN DIRECTION

604 — ENTER LIVE STEM-IMAGE ACQUISITION MODE

606 — SELECT GATING FREQUENCY AND ACTIVATE BEAM BLANKER

608 — VARY FOCUS OF PROBE WHILE MONITORING LIVE STEM IMAGES FOR MOIRE-FRINGE PATTERNS

610 — ACCEPTABLE CONTRAST?

NO → CHANGE GATING FREQUENCY — 612

YES

614 — DEACTIVATE BEAM BLANKER

END

700

BLANKER-ENHANCED MOIRE IMAGING

TECHNICAL FIELD

Various examples relate generally, but not exclusively, to electron microscopy components, instruments, systems, and methods.

SUMMARY

Moiré is a general phenomenon where two closely related patterns create a more slowly varying pattern. In scanning transmission electron microscopy (STEM), moiré patterns can be created when a sampling interval of the microscope is relatively close to a periodicity of the specimen's crystal lattice or its integer multiple. The spacing and orientation of STEM moiré fringes are sensitive to the local lattice periodicity and, as such, can be used, e.g., to reveal the strain field in the specimen.

The microelectronics industry has a need for effective tools to quantitatively measure strain in semiconductor devices. For example, strain in multi-compound semiconductor-based devices can either be unfavorable or advantageous, as strain may affect the incorporation of substituent atoms or provide ways to design electronic devices by strain engineering of the band gap and/or carrier mobility. In general, knowledge of the actual strain state of the specimen is of high importance for quality-control purposes. As such, strain-mapping methods and equipment providing suitable spatial resolution and precision coupled with sufficiently fast data acquisition and processing are of great interest to semiconductor companies.

Disclosed herein are, among other things, various examples, aspects, features, and embodiments of a scientific instrument having an electron-beam column equipped with a fast pre-sample beam blanker configured to gate the electron beam during a STEM imaging scan. In some examples, the beam blanker is beneficially used to enable acquisition of high-contrast moiré patterns with high scan speeds, e.g., having dwell times smaller than about 5 μs/pixel. In some other examples, the beam blanker is beneficially used to perform focusing of the electron probe based on moiré imaging. The latter feature can be used, e.g., to achieve fast and accurate optical alignment of the electron-beam optics for dose-sensitive samples, for which alternative focusing methods may subject the dose-sensitive sample to a degradingly high irradiation dose.

One example provides a scientific instrument comprising: an electron-beam column configured to scan an electron beam across a sample, the electron-beam column including a beam blanker configured to gate the electron beam in response to a drive signal; an electron detector configured to measure a flux of transmitted or scattered electrons having interacted with the sample; and an electronic controller configured to acquire an image of the sample using values of the flux measured with the electron detector for a plurality of electron-beam scan locations and further configured to cause the drive signal to have a gating frequency at which the image has a moiré pattern therein.

Another example provides a moiré imaging method comprising: scanning an electron beam across a sample with an electron-beam column including a beam blanker configured to gate the electron beam in response to a drive signal; measuring, with an electron detector, a flux of transmitted or scattered electrons having interacted with the sample; acquiring, with an electronic controller, an image of the sample using values of the measured flux for a plurality of electron-beam scan locations; and causing, with the electronic controller, the drive signal to have a gating frequency at which the image has a moiré pattern therein.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

DETAILED DESCRIPTION

Figure 1:
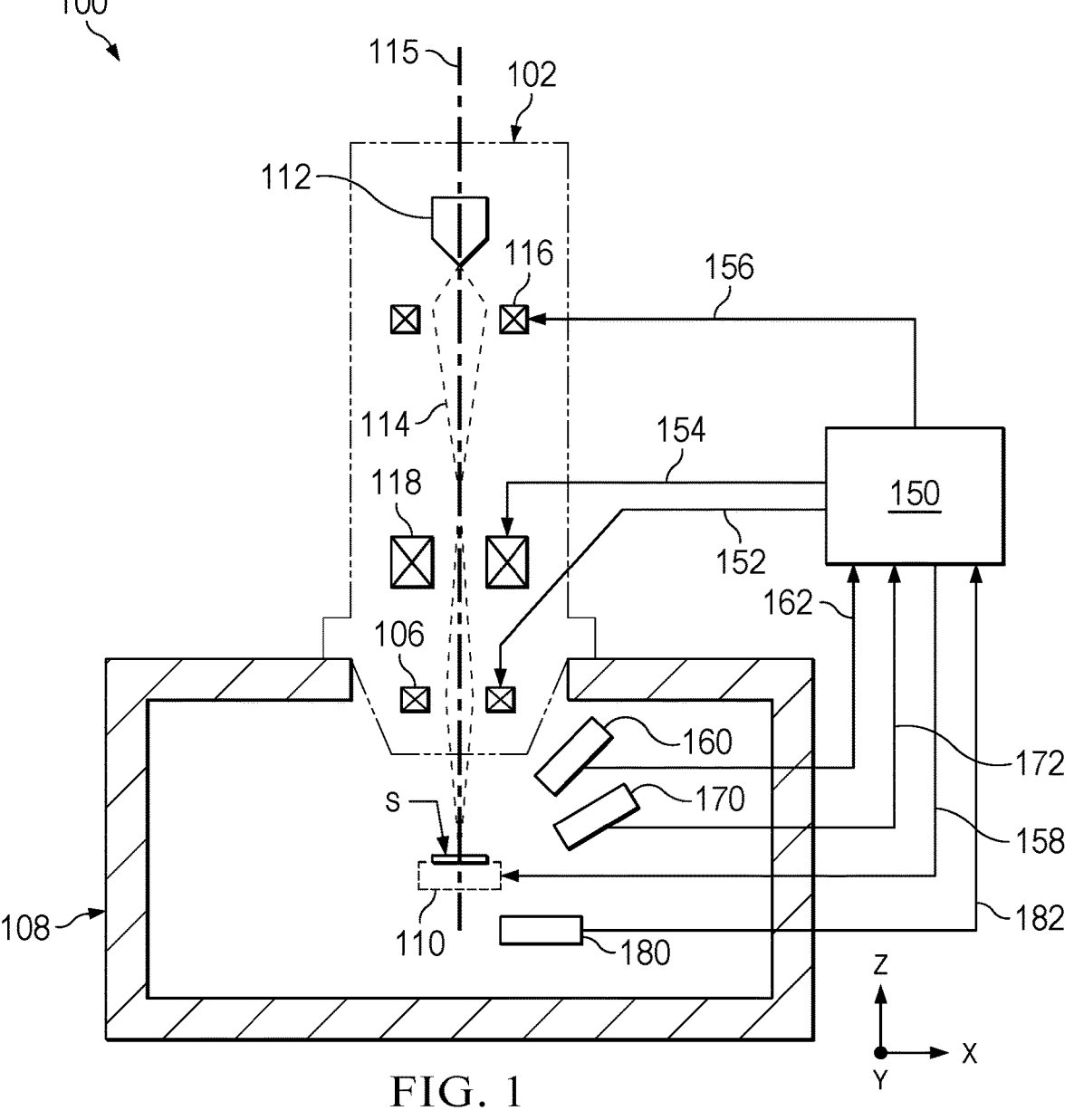
FIG. 1 is a block diagram illustrating an example scientific instrument in accordance with some embodiments.

FIG. 1 is a block diagram illustrating a scientific instrument 100 in accordance with some embodiments. The scientific instrument 100 includes a scanning transmission electron microscope (STEM) column 102 coupled to a vacuum chamber 108. The vacuum chamber 108 houses therein a movable sample holder 110 and can be evacuated using one or more vacuum pumps (not explicitly shown in FIG. 1). In an example embodiment, the sample holder 110 is independently movable parallel to the XY-coordinate plane and parallel to the Z-coordinate axis, with the corresponding coordinate system being indicated by the XYZ-coordinate triad shown in FIG. 1. A sample S to be interrogated using the scientific instrument 100 is mounted in sample holder 110 as indicated in FIG. 1.

In the example shown, the STEM column 102 comprises an electron source 112 and two or more electron-beam lenses, only two of which, i.e., an objective lens 106 and a condenser lens 116, are schematically shown in FIG. 1 for illustration purposes. In some examples, a different (from two) number of such lenses may be used in the STEM column 102. In some embodiments, the objective lens 106 can be an ultra-high-resolution (UHR) lens. In at least some embodiments, the STEM column 102 also includes a beam blanker, which is described in more detail below in reference to FIG. 4.

In operation, the electron source 112 generates an electron beam 114 propagating generally along a longitudinal axis 115 of the STEM column 102. Electron-beam lenses 106 and 116 are operated to generate electric and magnetic fields that affect electron trajectories in the electron beam 114. Control signals 152, 156 generated by an electronic controller 150 are used to change the strengths and/or spatial configurations of the fields and impart desired properties on the electron beam 114. In general, the electron-beam lenses 106 and 116, control signals 152 and 156, and other pertinent components of the STEM column 102 and electronic controller 150 can be used to perform various operations and support various functions, such as beam focusing, beam gating, aberration mitigation, aperture cropping, filtering, etc. The STEM column 102 further comprises a deflection unit 118 that can steer the electron beam 114 in response to a control signal 154 applied thereto by the electronic controller 150. Such beam steering can be used to move a focused portion of the electron beam 114 along a desired path across the sample S, e.g., to perform a raster or vector scan thereof.

The scientific instrument 100 also includes detectors 160, 170, 180 located in the vacuum chamber 108 in relatively close proximity to the sample S. In operation, the detectors 160, 170, and 180 generate streams of measurements as respective output signals 162, 172, and 182, which are received by the electronic controller 150. Specific types of the detectors 160, 170, 180 depend on the embodiment of the scientific instrument 100 and can typically be chosen from a variety of detector types suitable for detecting different types of emission and/or radiation from the sample S produced thereby in response to the electron beam 114. Example types of the emission/radiation that can be produced in this manner include, but are not limited to, X-rays, infrared light, visible light, ultraviolet light, back-scattered electrons, secondary electrons, Auger electrons, elastically scattered electrons, non-scattered (e.g., zero energy loss) electrons, and non-elastically scattered electrons. In various embodiments, a different (from three) number of such detectors can be used in the scientific instrument 100. In some embodiments, the detectors 160, 170, 180 are selected from the group consisting of a high-angle annular dark field (HAADF) detector, a medium-angle annular dark field detector, an annular bright field detector, a segmented annular detector, a differential phase contrast detector, an Electron Energy Loss Spectroscopy (EELS) detector, an Energy-Dispersive X-ray Spectroscopy (EDS) detector, and a two-dimensional (e.g., pixelated or segmented) electron detector. Other detectors capable of detecting various ones of the above-mentioned types of emission/radiation can also be used in various additional embodiments.

Figure 2:
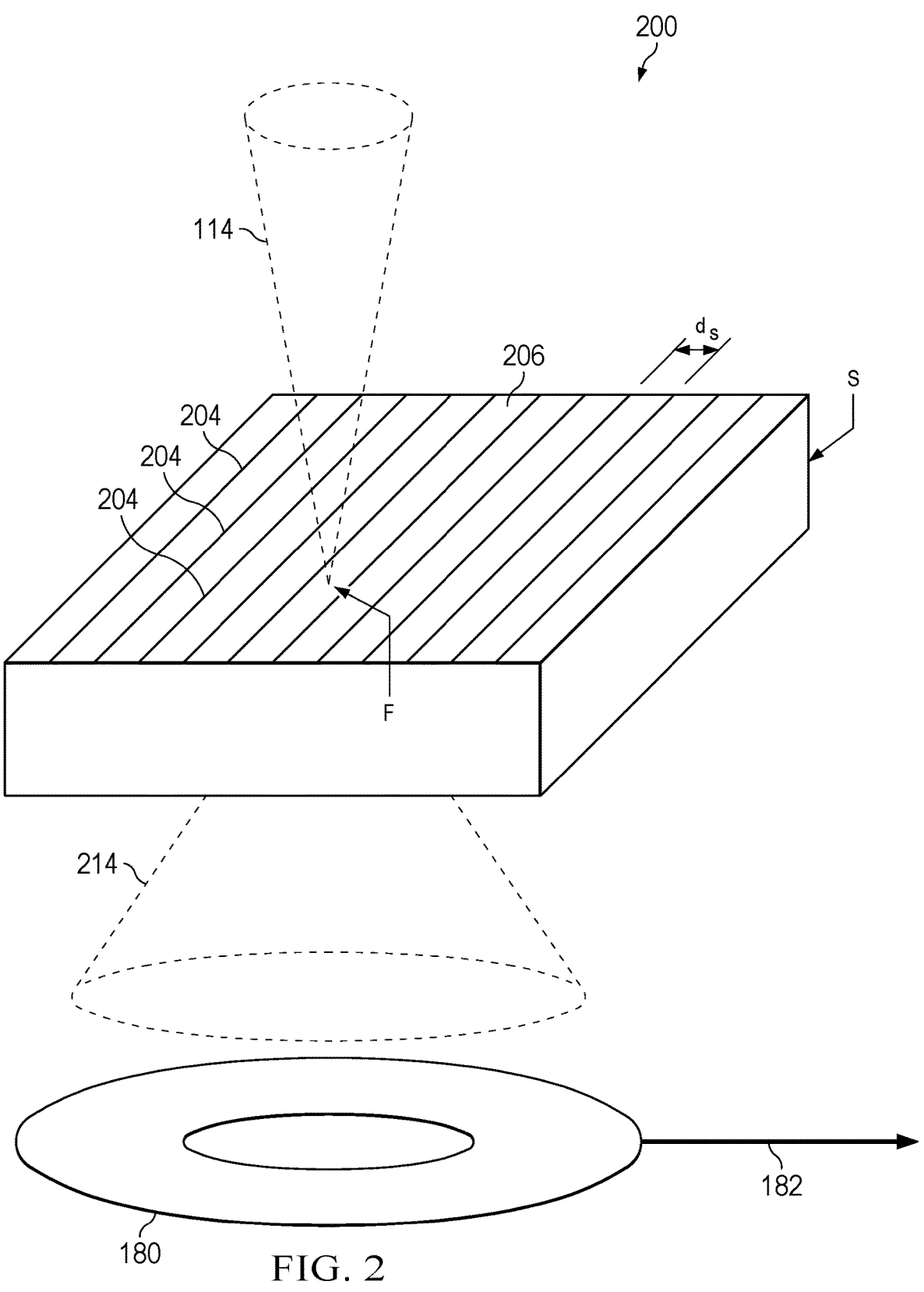
FIG. 2 is a block diagram illustrating acquisition of a moiré pattern in the scientific instrument of FIG. 1 in accordance with some embodiments.

FIG. 2 is a block diagram illustrating a configuration 200 of the scientific instrument 100 used for acquisition of a moiré pattern according to one example. In the example shown, the moiré pattern is captured using a HAADF detector 180 positioned as indicated in FIG. 2. In other examples, other suitable detectors available with the corresponding embodiment of the scientific instrument 100 can also be used (also see FIG. 1).

In operation, when a focused portion F of the electron beam 114 is scanned by the deflection unit 118 across the sample S in a raster pattern 206, the HAADF detector 180 captures a flux 214 of scattered electrons at each pixel of the raster pattern 206 and communicate the flux measurements, via its output signal 182, to the electronic controller 150. The electronic controller 150 then operates to generate a pixelated image representing the moiré pattern by appropriately sorting and processing the stream of electron-flux measurements received via the signal 182. Herein, the term "focused portion of the electron beam" refers to a portion of the electron beam 114 that has about (e.g., to within +10%) the smallest transverse cross-section area. A person of ordinary skill in the pertinent art will readily understand that, for many modalities of the scientific instrument 100, the focused portion F of the electron beam 114 needs to be relatively accurately placed on a surface of the sample S or appropriately positioned in the sample S.

The raster pattern 206 has a plurality of parallel scan lines 204 with a spacing $d_s$ therebetween. Herein, the spacing $d_s$ between the scan lines 204 is referred to as "scan-grating spacing." Moiré fringes typically appear in the STEM image captured with the HAADF detector 180 when the scan-grating spacing $d_s$ is relatively close to a crystal lattice spacing (di) in the sample S or an integer multiple thereof. In some configurations of the scientific instrument 100, the scan-grating spacing $d_s$ is smaller than the crystal lattice spacing $d_l$. In some other configurations of the scientific instrument 100, the scan-grating spacing $d_s$ is greater than the crystal lattice spacing $d_l$.

Relatively strong scattering of the electron beam 114 occurs when a scan line 204 is directly on top of the lattice atoms of the sample S, which results in bright bands in the captured STEM image. Scattering of the electron beam 114 is significantly reduced when a scan line 204 is between the lattice planes, which results in dark bands in the captured STEM image. Such bright and dark bands are (quasi) periodically repeated to form the moiré fringes. The contrast pattern observed with a brightfield detector is substantially inverse to that observed with a darkfield detector. The corresponding moiré-fringe spacing ($d_{mf}$) can be expressed as follows:

$$d_{mf} = \frac{d_s d_l}{|d_s - d_l|} \tag{1}$$

Eq. (1) indicates that, when the moiré pattern is acquired with $d_l < d_s$, the fringe spacing $d_{mf}$ increases as the crystal lattice spacing $d_l$ expands. When the moiré pattern is acquired with $d_l > d_s$, the behavior of the fringe spacing $d_{mf}$ is reversed. As already mentioned above, the crystal lattice spacing $d_l$ can be used to reveal the strain field present in the sample S. Several examples of moiré patterns and their usage for strain mapping are described, e.g., in Suhyun Kim, Sungho Lee, Yoshifumi Oshima, et al., "Scanning moiré fringe imaging for quantitative strain mapping in semiconductor devices," Appl. Phys. Lett. 102, 161604 (2013), which is incorporated herein by reference in its entirety.

Figure 3A:
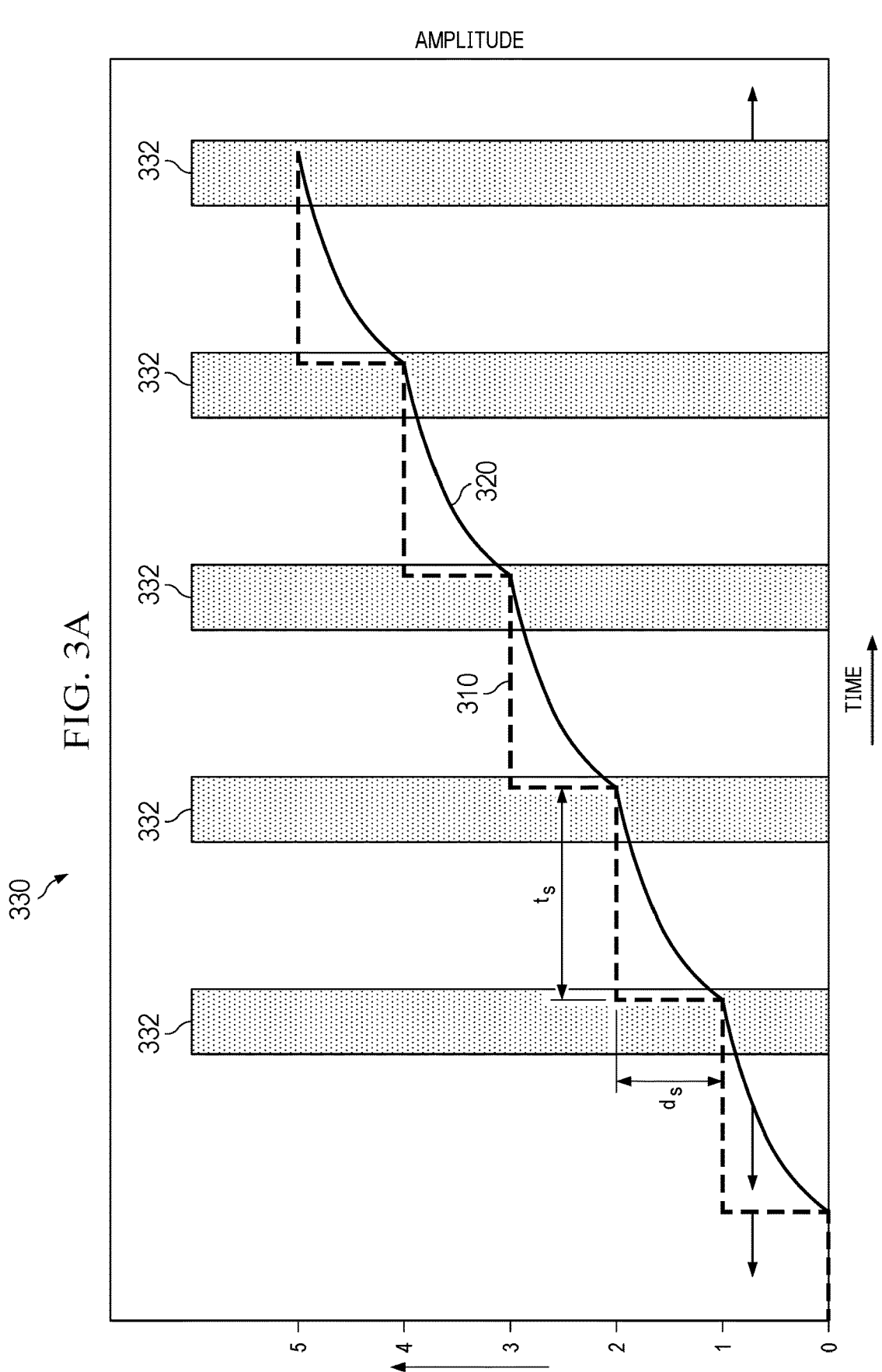
FIGS. 3A-3B graphically illustrate certain operating characteristics of the scientific instrument of FIG. 1 in the configuration illustrated in FIG. 2 according to some examples.
Figure 3B:
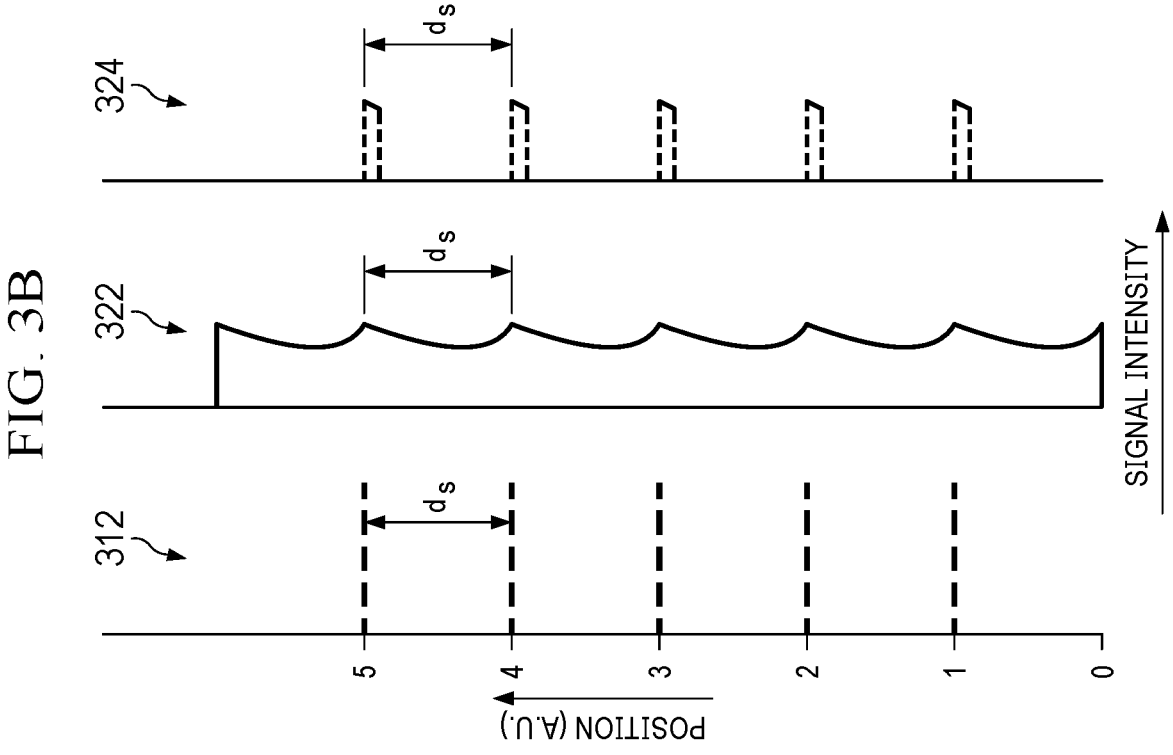

FIGS. 3A-3B graphically illustrate certain operating characteristics of the scientific instrument 100 in the configuration 200 according to some examples. First, we note that the contrast of a moiré pattern in the STEM image acquired using the configuration 200 depends on the electron beam 114 being sufficiently stationary during a dwell time (ta) at every scan-pixel position of the raster pattern 206. As such, nearly optimal contrast for a detected moiré pattern is expected when the electron beam 114 advances along the scan path in a step-like manner indicated by a staircase function 310 plotted in FIG. 3A. In accordance with the staircase function 310, the electron beam 114 remains in a fixed (stationary) position for the dwell time $t_d$ and then rapidly jumps by the distance $d_s$ to a next fixed position where the electron beam 114 again remains stationary for another dwell time $t_d$. As used herein, the term "rapidly jumps" means that the transition between the two fixed positions is substantially completed within a time interval that is much shorter (e.g., by a factor >10) than the dwell time $t_d$. Such rapid jumps are repeated (typically in two dimensions, possibly with different respective distances $d_s$) until all scan pixels of the raster pattern 206 are interrogated. In an example implementation of the scan electronics used in the scientific instrument 100, the time dependence of the position of the electron beam 114 represented by an ideal-ized staircase function is obtainable only theoretically but not practically, e.g., due to a slower-than-ideal frequency response of the scan electronics to step-like voltage transi-tions. As such, example embodiments disclosed herein are directed at providing alternative solutions that are effective for moiré-pattern acquisitions as explained in more detail below.

For a STEM image size of 512×512 pixels, a dwell time $t_d$=40 μs/pixel results in an image acquisition time of approximately 11 seconds. For a STEM image size of 1024×1024 pixels, the same dwell time results in an image acquisition time of approximately 42 seconds. Disadvanta-geously, acquisition times this long may not be acceptable for at least some moiré-imaging applications. For example, moiré-pattern acquisition times shorter than about one sec-ond appear to be targeted by semiconductor companies. For a moiré-pattern image size of 1024×1024 pixels, the target acquisition time of 1 s translates into a dwell time ta of approximately 1 μs/pixel.

For dwell times $t_d$ in the vicinity of 1 μs/pixel, a finite frequency response of the deflection unit 118 and of the associated electronics typically leads to a distortion of the staircase function 310. An example of such distortion is illustrated in FIG. 3A by a waveform 320. Note that, instead of the rapid jumps of the staircase function 310, the wave-form 320 has "rounded" steps that cause inter-pixel transi-tions during which the electron beam 114 gradually drifts between the two intended fixed positions, thereby effectively interrogating a continuous range of locations within the crystal lattice of the sample S. A typical disadvantageous effect of such drift is that the corresponding acquired moiré-pattern image becomes smeared out, e.g., has a relatively low moiré-fringe contrast or altogether fails to exhibit any usable moiré fringes.

FIG. 3B graphically illustrates signal-origination patterns 312, 322 corresponding to the staircase function 310 and waveform 320, respectively. The signal-origination pattern 312 is characterized by a high degree of localization due to which the corresponding electron flux 214 primarily origi-nates from a plurality of equidistant discrete locations (spots) within the sample S. In contrast, the signal-origina-tion pattern 322 has a relatively low degree of localization due to which the corresponding detected electron flux 214 originates from a contiguous range of locations within the sample S, with only a small fraction of the flux 214 originating from the discrete locations belonging to the signal-origination pattern 312. The latter attribute of the signal-origination pattern 322 disadvantageously causes the corresponding moiré-fringe contrast of be nonoptimal at high scan speeds.

According to one embodiment, the STEM column 102 of the scientific instrument 100 is equipped with a beam blanker that is controllably switchable between ON and OFF states in response to a gating signal. The gating signal acts as a control mechanism, determining when the electron beam 114 can pass through the beam blanker toward the sample S and when the electron beam 114 is blocked or diverted from propagating downstream and reaching the sample S. In one example, the gating signal is a binary signal alternating between a first (e.g., high) level and a second (e.g., low) level. When the gating signal is at the first level, the beam blanker operates to let the electron beam 114 pass therethrough toward the sample S. When the gating signal is at the second level, the beam blanker operates to stop (block) the electron beam 114 from propagating downstream along the longitudinal axis 115 toward the sample S. In one example, transitions between the first and second levels in the gating signal are timed such that the beam blanker transforms the signal-origination pattern from the signal-origination pattern 322 (produced without the beam blanker or with the deactivated beam blanker) into a signal-origina-tion pattern 324 shown in FIG. 3B. Beneficially, the signal-origination pattern 324 mimics (e.g., closely approximates) the signal-origination pattern 312 corresponding to the stair-case function 310 and, as such, causes the corresponding acquired moiré-pattern image to have a relatively high fringe contrast.

FIG. 3A graphically shows an example gating signal 330 that can be used to drive the beam blanker. The gating signal 330 includes a sequence of gating pulses 332 that are synchronized with the acquisition scan such that the electron beam 114 is only un-blanked briefly at every scan pixel, e.g., with an un-blank duty cycle being approximately 10%. The gating signal 330 causes the STEM column 102 to produce an illumination pattern on the sample S that substantially consists of a sequence of discrete illumination spots even if the deflection unit 118 and the scan electronics connected thereto produce a gradual beam sweep exemplified by the waveform 320. As such, the signal-origination pattern 322 is replaced by the signal-origination pattern 324 (see FIG. 3B), with the resulting moiré-fringe contrast beneficially approaching an optimal contrast typically associated with the staircase function 310, in at least some cases.

In embodiments of the scientific instrument 100 in which a decrease of the dwell time ta causes the deflection unit 118 and the scan electronics connected thereto to produce a "blurred" response (as opposed to a relatively smooth response exemplified by the waveform 320, FIG. 3A), the gating signal applied to the beam blanker can be phase-shifted such that the electron beam 114 is un-blanked when its position is most stationary within the "blurred" response.

In the example shown in FIG. 3A, the frequency of the gating signal 330 is phase-locked to the sampling frequency of the STEM acquisition scan, with the selected fixed phase shift between the gating and scan signals resulting in the gating pulses 332 being aligned with the step transitions of the staircase function 310. In other examples, other values of the fixed phase shift between the gating and scan signals can also be selected. Typically, better results are obtained when the value of the fixed phase shift between the gating and scan signals is selected such that the gating pulses 332 are aligned with the slower portion of the waveform 320 or functional equivalent thereof, whereat the position of the electron beam 114 is more stationary.

In some examples, the frequency of the gating signal applied to the beam blanker is decoupled from the sampling frequency of the STEM acquisition scan. This configuration can be used, e.g., to sweep the frequency of the gating signal around an initial guess value, until sufficient moiré-fringe contrast appears in the STEM image, in the fast scan direction. In FIG. 2, the fast scan direction is represented by the scan lines 204, and the slow scan direction is orthogonal to the scan lines 204. To ensure substantially homogeneous illumination intensities per scan pixel, the frequency of the gating signal typically needs to remain equal to or higher than the sampling frequency, and the detector output signal needs to be bandpass filtered to at least below the gating frequency. Other suitable methods to even out the illumination of different scan pixels can also be used in such examples.

In an example workflow based on this method, an experiment may start with a sweep of the gating frequency until an approximately maximum moiré-fringe contrast is realized for a region of interest (ROI) or for a reference area of the sample S. In some examples, the reference area is an area of the sample S where a zero strain is expected. Next, a full scan of the ROI may be performed at the determined gating frequency to ensure a high moiré-fringe contrast in the fast scan direction. Optionally, another frequency sweep and another full scan may be performed, but with the fast and slow scan directions interchanged, to achieve an independently optimized moiré-fringe contrast for the orthogonal scan direction. In some examples, the full scans may be performed with two or more slightly different gating frequencies corresponding to an approximately optimal contrast. This feature can be used, e.g., to resolve sign ambiguities (if any) in the strain map and improve the accuracy and/or spatial resolution of the strain map.

Figure 4:
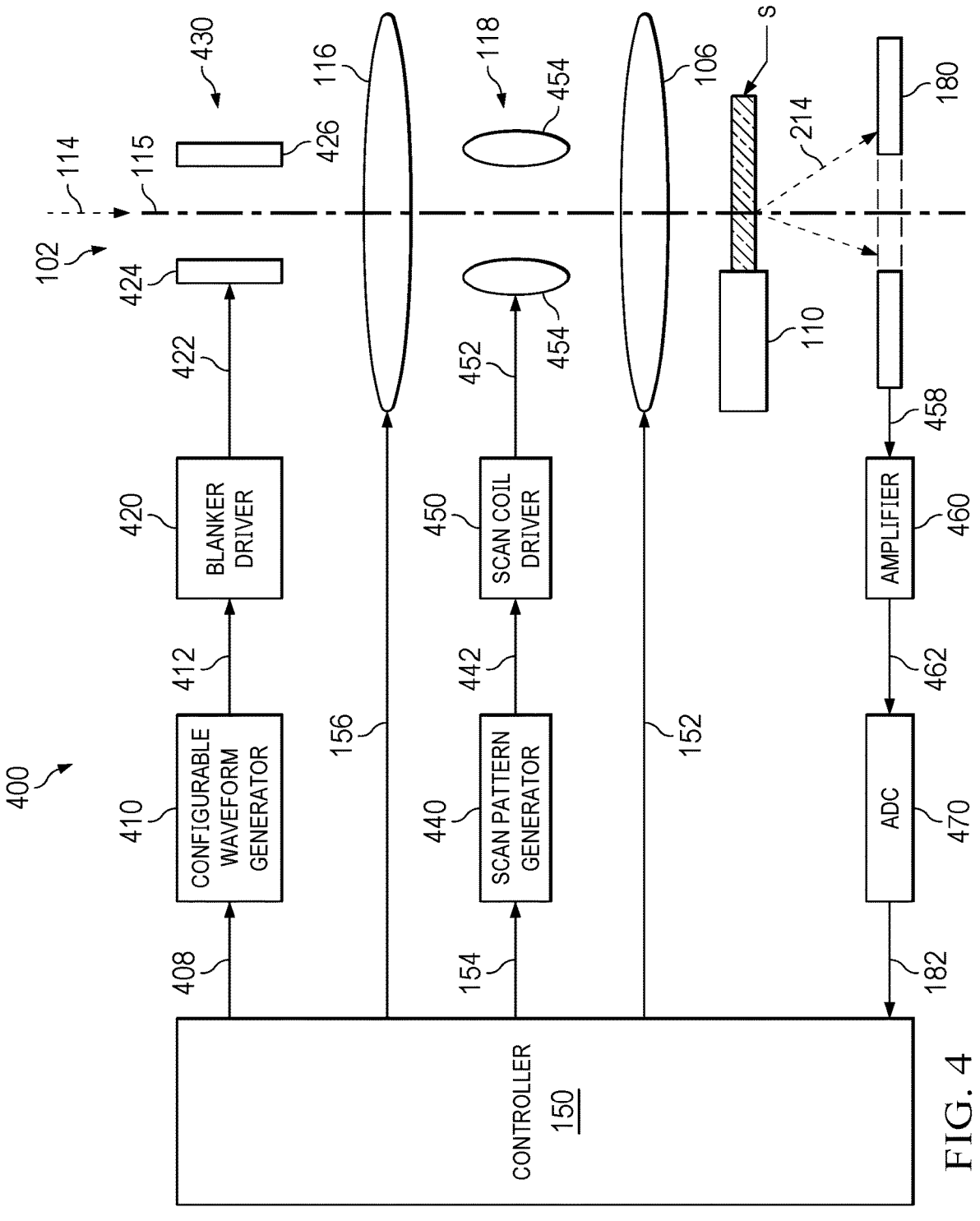
FIG. 4 is a block diagram illustrating an electrical circuit used in the scientific instrument of FIG. 1 in accordance with some embodiments.

FIG. 4 is a block diagram illustrating an electrical circuit 400 used in the scientific instrument 100 in accordance with some embodiments. The electrical circuit 400 includes the electronic controller 150, circuit blocks 410, 420, 440, 450, 460, and 470, a pre-sample beam blanker 430 and other pertinent components of the STEM column 102, and the detector 180. The STEM column 102 includes the beam blanker 430. In the example shown, the beam blanker 430 is positioned between the electron source 112 (see FIG. 1) and the electron-beam lens 116. In other examples, the beam blanker 430 can be placed in another suitable pre-sample location in the STEM column 102.

In the example shown, the pre-sample beam blanker 430 includes an electrostatic beam deflector comprising first and second electrodes 424, 426. When a sufficiently strong electric field is present between the electrodes 424 and 426 (due to appropriate electrical biasing thereof), the electric field interacts with the electron beam 114, thereby deflecting the beam away from the longitudinal axis 115. A beam catcher (not explicitly shown in FIG. 4) then intercepts (stops) the deflected electron beam 114 and directs the corresponding electrical current to a charge sink, e.g., to a ground terminal of the electrical circuit 400. When an electric field is absent between the electrodes 424 and 426, the electron beam 114 passes through the beam blanker 430 undeflected and continues to propagate along the longitudinal axis 115 toward the sample S. In other examples, other suitable physical mechanisms for gating the electron beam 114 in the beam blanker 430 can also be implemented.

In response to a drive signal 422 received from the driver circuit 420, the beam blanker 430 operates to stop and pass through the electron beam 114 at different times. The driver circuit 420 operates to generate the drive signal 422 in response to a gating signal 412 received from the configurable waveform generator 410. The gating signal 330 shown in FIG. 3A is an example of the gating signal 412. The electronic controller 150 operates to set various parameters of the gating signal 412 via a control signal 408 applied to the configurable waveform generator 410. Common control over the control signals 408 and 154 exerted by the electronic controller 150 enables any desired synchronization of the gating signal 412 with a scan signal 452 applied to scan coils 454 of the deflection unit 118 via the scan pattern generator 440 and the scan coil driver 450. As already mentioned above, in some configurations, the phase and frequency of the gating signal 412 may be decoupled from the phase and frequency of the scan signal 452.

In some examples, a scan signal 442 generated by the scan pattern generator 440 in response to the control signal 154 includes the staircase function 310 illustrated in FIG. 3A. At relatively low scan speeds (relatively long dwell times $t_d$), the corresponding scan signal 452 generated by the scan coil driver 450 in response to the scan signal 442 accurately follows the staircase function 310. However, at relatively high scan speeds (relatively short dwell times $t_d$), a finite frequency response of the scan coil driver 450 may lead to a distortion of the staircase function 310, thereby causing the corresponding scan signal 452 to become qualitatively similar to the waveform 320 illustrated in FIG. 3A.

The blanking and un-blanking of the electron beam 114 imposed by the beam blanker 430 modulates the electron flux 214 accordingly. In some examples, a signal-origination pattern for the electron flux 214 resulting from such modulation may be similar to the signal-origination pattern 324 illustrated in FIG. 3B. In response to the modulated electron flux 214, the detector 180 generates a corresponding output signal 458, which is then amplified in the amplifier circuit 460. A resulting amplified signal 462 is converted into digital form in the analog-to-digital converter (ADC) 470, and the resulting digital stream 182 is directed to the electronic controller 150 for processing. Based on the received digital stream 182, the electronic controller 150 composes a STEM image, which may contain a moiré pattern in at least some cases.

Figure 5:
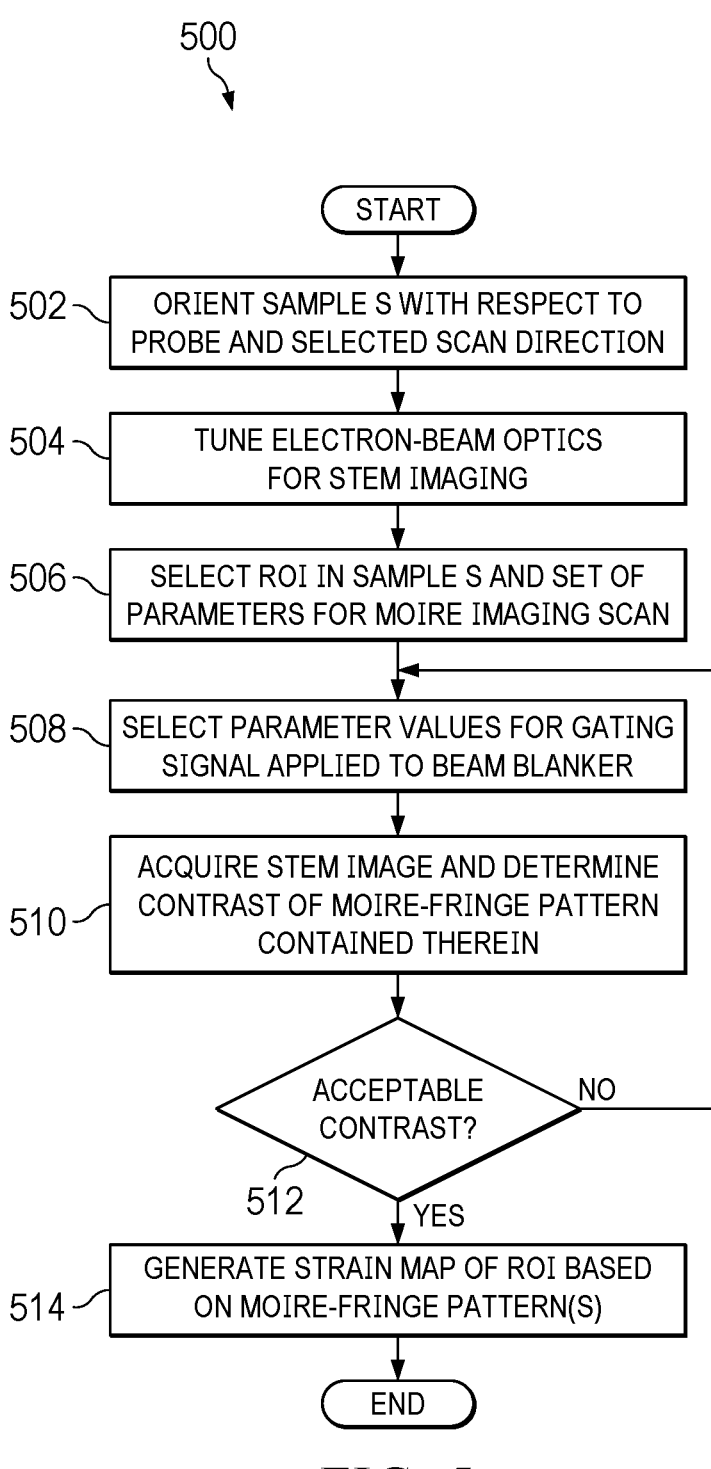
FIG. 5 is a flowchart illustrating a method of strain mapping based on moiré imaging implemented in the scientific instrument of FIG. 1 in accordance with some embodiments.

FIG. 5 is a flowchart illustrating a method 500 of strain mapping based on moiré imaging implemented in the scientific instrument 100 in accordance with some embodiments. The method 500 is described below with continued reference to FIGS. 1-5. In some examples, a corresponding embodiment of the scientific instrument 100 includes the beam blanker 430 and the electrical circuit 400 (FIG. 4). Example use cases for the method 500 include, but are not limited to, strain mapping in Si-based semiconductor devices, interface strain mapping in polycrystalline materials (e.g., steel) or multilayer strictures, and strain mapping around precipitates or crystal defects (such as stacking faults, dislocations, and the like).

The method 500 includes appropriately orienting the sample S with respect to the longitudinal axis 115 of the STEM column 102 and with respect to a selected scan direction of the raster pattern 206 (in a block 502) (also see FIGS. 1, 2). In some examples, the orienting operations of the block 502 may alternatively include orienting the scan direction to the orientation of the sample S (e.g., around the longitudinal axis of the column). Operations of the block 502 also include the electronic controller 150 operating the movable sample holder 110, via a control signal 158 (FIG. 1), such that a selected zone axis of the sample S becomes properly aligned for moiré imaging. In response to the control signal 158, the movable sample holder 110 may perform appropriate translations and/or rotations of the sample S with respect to the XYZ-coordinate frame (also see FIG. 1).

Herein, the term "zone axis" refers to a selected one of high-symmetry orientations in a crystal referenced to the direct lattice (as opposed to the reciprocal lattice) of the crystal in three dimensions. A zone axis is therefore conventionally indexed with direct lattice indices, rather than with Miller indices. Typically, a zone axis is aligned with a corresponding direction of "tunnels" present between planes of atoms in the crystal.

The method 500 also includes the electronic controller 150 appropriately tuning the electron-beam optics of the STEM column 102 for STEM imaging (in a block 504). In some examples, the tuning operations of the block 504 include Ronchigram alignment, which involves tuning of the electron-beam optics based on observed Ronchigram patterns. Using Ronchigram alignment, both lower order and higher order aberrations can be corrected. In some implementations, after the Ronchigram alignment, a condenser lens aperture is inserted and then at least some residual aberrations are finely corrected to obtain a high-quality STEM image.

The method 500 also includes selecting (i) a ROI in the sample S and (ii) a set of parameter values for the moiré imaging scan (in a block 506). In some examples, the electronic controller 150 performs these selections in the block 506 based on an input from an operator of the scientific instrument 100. In some other examples, the electronic controller 150 performs these selections in the block 506 in an automated manner, e.g., by running a suitable programmatic script. Example parameters selected in the block 506 include, but are not limited to, magnification (scan amplitude) and the number of scan pixels (e.g., 1024×1024).

The method 500 also includes the electronic controller 150 selecting parameter values for the gating signal 412 (in a block 508). In some examples, the electronic controller 150 performs the parameter selections in the block 508 based on an input from an operator of the scientific instrument 100. In some other examples, the electronic controller 150 performs the parameter selections in the block 506 in an automated manner, e.g., by running a suitable programmatic script. Example parameters selected in the block 508 include, but are not limited to, the frequency and duty cycle of the gating signal 412.

As explained in more detail below, operations of the block 508 are a part of a processing loop including blocks 508, 510, and 512. In some examples, the first instance of the block 508 includes initial selections of parameter values for the gating signal 412. Each of subsequent instances of the block 508 includes one or more respective adjustments to the previously selected parameter values, e.g., based on the results of the blocks 510, 512. For example, in some implementations of the processing loop 508/510/512, the block 508 is configured to implement a sweep of the gating frequency while the sampling frequency of the scan signal 452 remains fixed. In some examples, the frequency increment for the frequency sweep has a fixed value. In some other examples, the frequency increment depends on the difference between the observed moiré-fringe contrast and a threshold contrast value used in the decision block 512. More specifically, more aggressive changes of the gating frequency may be performed for relatively large contrast differences than for relatively small contrast differences.

The method 500 also includes the electronic controller 150 acquiring a STEM image (in the block 510). Example operations of the block 510 include the electronic controller 150 operating various components of the STEM column 102 and various circuit blocks of the electrical circuit 400, e.g., as described above in reference to FIG. 4, and receiving the corresponding digital stream 182 from the detector 180. For example, the STEM column 102 is operated using the selections made in the block 506. The beam blanker 430 is driven using the gating signal 412 that is configured in accordance with the selections made in the block 508. In various examples, the detector used for the STEM image acquisition in the block 510 is selected from the group consisting of a HAADF detector, a medium-angle annular dark field detector, an annular bright field detector, a segmented annular detector, a differential phase contrast detector, an EELS detector, an EDS detector, and a two-dimensional (e.g., pixelated or segmented) electron detector. Operations of the block 510 further include the electronic controller 150 compositing a STEM image from the data conveyed by the received digital stream 182 and applying a suitable image-processing algorithm to the composited STEM image to determine the contrast of a moiré-fringe pattern contained therein.

Operations of the decision block 512 of the method 500 include the electronic controller 150 determining whether the contrast of the moiré-fringe pattern is acceptable. In some examples, this determination is made by comparing the moiré-fringe pattern contrast determined in the block 510 with the above-mentioned threshold contrast value. When the moiré-fringe contrast is of a higher value than the threshold contrast value ("Yes" at the decision block 512), the processing of the method 500 is directed to a block 514. When the moiré-fringe contrast is of a lower value than the threshold contrast value ("No" at the decision block 512), the processing of the method 500 is looped back to the block 508.

Operations of the block 514 include the electronic controller 150 generating a strain map of the ROI of the sample S based on the moiré-fringe pattern contained in the STEM image acquired in the last instance of the block 510. In some examples, the electronic controller 150 first operates to determine spatial variations of the crystal lattice spacing $d_l$ in the ROI of the sample S by applying Eq. (1) to various parts of the STEM image. The electronic controller 150 then operates to generate the strain map of the ROI of the sample S using the known relationship between spatial variations of the crystal lattice spacing $d_l$ and the strain field. After the strain map is generated, the processing of the method 500 is terminated.

In some embodiments, prior to the above-described operations of the block 514, the above-described processing corresponding to the blocks 502-512 of the method 500 is repeated for one or more rotated scan patterns to acquire at least a second STEM image containing at least a second moiré-fringe pattern corresponding to the same ROI of the sample S. Operations of the block 514 then include the electronic controller 150 jointly analyzing the at least two moiré-fringe patterns to generate the strain map of the ROI. Such joint analysis tends to beneficially produce a more accurate and/or more detailed strain map than any of the strain maps derived from the individual moiré-fringe patterns used in the joint analysis.

Figure 6:
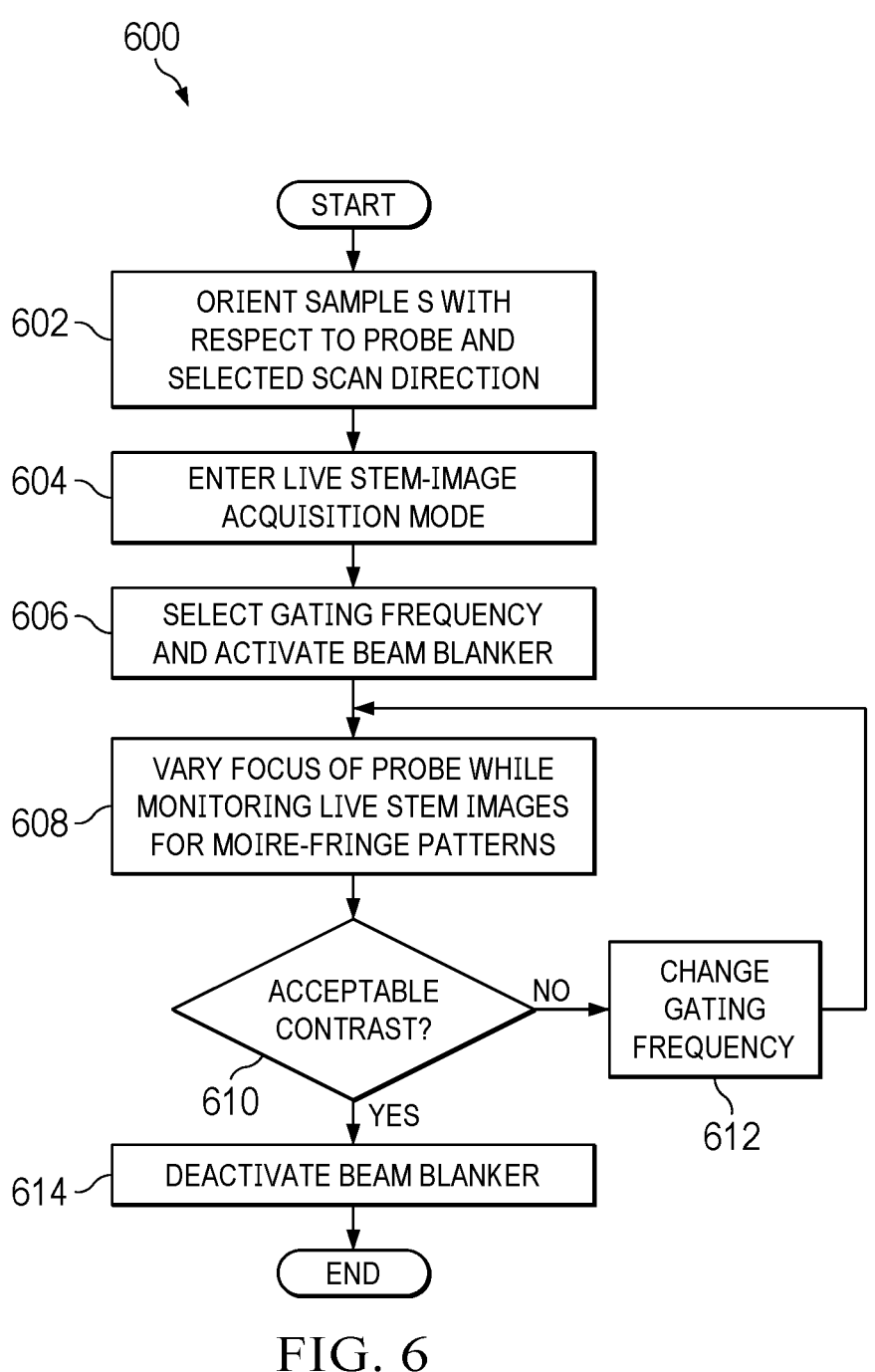
FIG. 6 is a flowchart illustrating a method of low-dose tuning of the electron-beam optics in the scientific instrument of FIG. 1 based on moiré imaging in accordance with some embodiments.

FIG. 6 is a flowchart illustrating a method 600 of low-dose tuning of the electron-beam optics in the scientific instrument 100 based on moiré imaging in accordance with some embodiments. Example use cases for the method 600 include, but are not limited to, STEM imaging of dose-sensitive materials, such as Metal Organic Frameworks (MOFs), organic polymers, electric-battery materials, and the like. For example, some conventional electron-beam-optics focusing methods for high resolution STEM use 5× oversampling, which may disadvantageously subject a dose-sensitive material of the sample S to a degradingly high irradiation dose. In contrast, example embodiments of the method 600 are beneficially capable of achieving a comparable quality of optical alignment with lower oversampling or without oversampling at all (e.g., with approximately 1×sampling), thereby reducing the irradiation dose by a factor of ten or more.

The method 600 includes appropriately orienting the sample S with respect to the longitudinal axis 115 of the STEM column 102 and with respect to a selected scan direction of the raster pattern 206 (in a block 602). In some examples, the orienting operations of the block 602 may alternatively include orienting the scan direction to the orientation of the sample S (e.g., around the longitudinal axis of the column). In some examples, operations of the block 602 are analogous to the above-described operations of the block 502 of the method 500.

The method 600 also includes the electronic controller 150 placing the scientific instrument 100 into a live STEM-image acquisition mode at high magnification (in a block 604). When in the live STEM-image acquisition mode, the electronic controller 150 operates the STEM column 102, the associated circuitry, and the detector 180 such that a sequence of STEM images of the sample S is being continuously acquired by the electronic controller 150 via the detector output signal 182. In some examples, the sampling step of the scan (distance between adjacent scan pixels) for the STEM imaging is selected to be larger than the crystal lattice spacing $d_l$ of the sample S.

The method 600 also includes the electronic controller 150 selecting the frequency of the gating signal 412 and activating the beam blanker 430 (in a block 606). In some examples, the electronic controller 150 operates to select the gating frequency in the block 606 based on an input from an operator of the scientific instrument 100. In some other examples, the electronic controller 150 operates to select the gating frequency in the block 606 in an automated manner, e.g., by running a programmatic script configured to compute an estimated suitable value of the gating frequency based on the scan speed and sampling (nm/pixel) used in the live STEM acquisition mode configured in the block 604.

In some examples, the sampling of the crystal lattice is set based on the field of view (FOV) and the number of pixels being scanned. For atomic imaging, a three to ten times oversampling of the lattice may be used. In some conventional approaches, when the number of pixels is reduced, the scientific instrument still in effect scans the sparse area between adjacent pixels when moving the probe from one pixel to the next pixel if the probe size is smaller than the pixel spacing. Such scanning may disadvantageously reduce the contrast and/or cause a smear effect. The use of blanking substantially avoids these disadvantageous effects and at the same time beneficially reduces the radiation dose to which the sample S is exposed because, with the activated beam blanker 430, the area in-between the pixels is no longer exposed to radiation. A similar beneficial effect may not be achievable under conventional approaches through a faster scan, e.g., because the faster the scan, the smaller the ratio of the pixel signal to the signal originating from the area in-between the pixels. Thus, a simple reduction of the sampling rate in a fixed FOV does not provide the same benefits as the use blanking. In contrast, the use of blanking can advantageously provide the above-explained benefits when used for producing moiré conditions and for focus finding applications.

The method 600 also includes the electronic controller 150 tuning the electron-beam optics of the STEM column 102 (in a block 608). The tuning operations of the block 608 are configured to move the focused portion F of the electron beam 114 vertically, along the longitudinal axis 115, in an attempt to find a position thereof in which the focused portion F is substantially at the appropriate position for imaging (e.g., on the surface of the sample S) as indicated in FIG. 2. Since a moiré-fringe pattern becomes visible in the STEM images that are being continuously acquired only when the focused portion F of the electron beam 114 is sufficiently close to that position, the electronic controller 150 also operates, in the block 608, to continuously evaluate the STEM images of the live sequence of STEM images for the presence of a moiré-fringe pattern.

In some examples of the block 608, the increment with which the vertical position of the focused portion F of the electron beam 114 is adjusted depends on whether the moiré-fringe pattern is visible in the live STEM images. More specifically, the electronic controller 150 may be configured to use larger vertical increments when a moiré-fringe pattern is not yet visible in the live STEM images. Once moiré-fringe pattern becomes visible in the live STEM images, the electronic controller 150 may reduce the vertical increment and fine-tune the vertical position of the focused portion F of the electron beam 114 using smaller increments in order to achieve a better contrast of the observed moiré-fringe pattern.

Operations of a decision block 610 of the method 600 include the electronic controller 150 determining whether the contrast of the moiré-fringe pattern observed in the block 608 is acceptable. In some examples, this determination is made by comparing the moiré-fringe pattern contrast observed in the block 608 with a threshold contrast value. When the moiré-fringe contrast is of a lower value than the threshold contrast value ("No" at the decision block 610), the processing of the method 600 is directed to a block 612. As used herein, the term "of a lower value" should be construed to cover situations in which a moiré-fringe pattern has not yet appeared in the live STEM images during the tuning operations of the block 608. When the moiré-fringe contrast is of a higher value than the threshold contrast value ("Yes" at the decision block 610), the processing of the method 600 is directed to a block 614. Note that a high moiré-fringe contrast is an indication of the electron beam 114 being in focus, e.g., with the focused portion F thereof being close to the appropriate vertical position as illustrated in FIG. 2.

Operations of the block 612 include the electronic controller 150 changing the frequency of the gating signal 412. In some examples, the electronic controller 150 operates to change the gating frequency in the block 612 based on an input from an operator of the scientific instrument 100. In some other examples, the electronic controller 150 operates to increment the gating frequency in the block 612 in an automated manner, e.g., by running a programmatic script configured to compute an increment value for the gating frequency based on auxiliary information available to the electronic controller 150. Such auxiliary information can be extracted, e.g., from the available information about the sample S, the current configuration of the STEM scan, and/or live STEM images. After the gating frequency is changed in the block 612, the processing of the method 600 is directed back to the block 608.

Operations of the block 614 include the electronic controller 150 deactivating the beam blanker 430, canceling the live STEM acquisition mode, and optionally entering another operating mode, e.g., an operating mode for which the focusing of the electron beam 114 was performed by executing the method 600. Thereafter, the method 600 is terminated.

Figure 7:
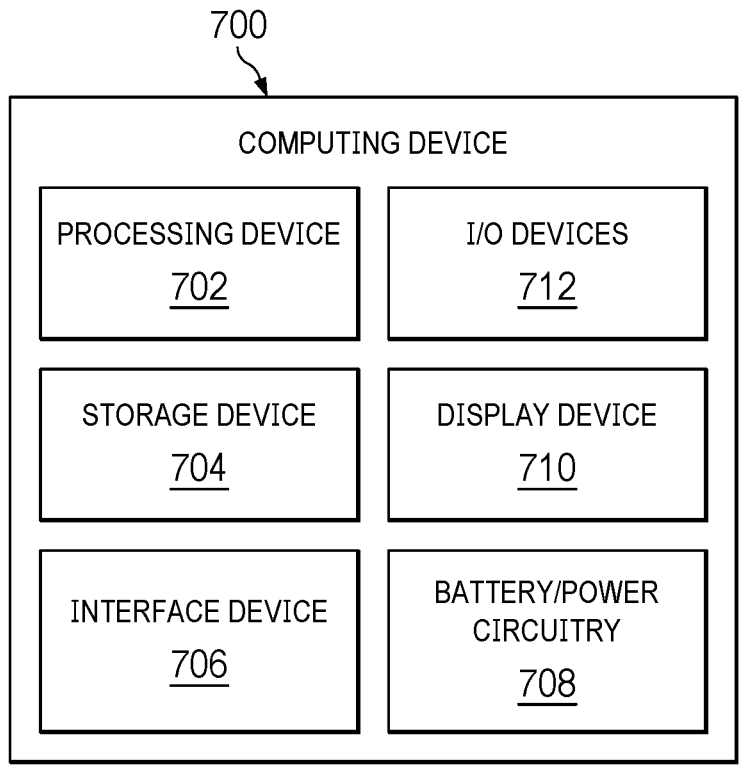
FIG. 7 is a block diagram of an example computing device configured to perform at least some scientific-instrument support operations in accordance with various embodiments.

FIG. 7 is a block diagram of an example computing device 700 configured to perform at least some scientific-instrument support operations in accordance with various embodiments. For example, in some embodiments, the computing device 700 performs at least some operations of the electronic controller 150 (also see FIGS. 1 and 4-6). In various embodiments, a support module of the scientific instrument 100 may be implemented by a single computing device 700 or by multiple computing devices 700.

The computing device 700 of FIG. 7 is illustrated as having a number of components, but any one or more of these components may be omitted or duplicated, as suitable for the application and setting. In some embodiments, some or all of the components included in the computing device 700 may be attached to one or more motherboards and enclosed in a housing. In some embodiments, some of those components may be fabricated onto a single system-on-a-chip (SoC) (e.g., the SoC may include one or more processing devices 702 and one or more storage devices 704). Additionally, in various embodiments, the computing device 700 may not include one or more of the components illustrated in FIG. 7, but may include interface circuitry for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 700 may not include a display device 710, but may include display device interface circuitry (e.g., a connector and driver circuitry) to which an external display device 710 may be coupled.

The computing device 700 includes a processing device 702 (e.g., one or more processing devices). As used herein, the term "processing device" refers to any device or portion of a device that processes electronic data from registers and/or memory to transform that electronic data into other electronic data that may be stored in registers and/or memory. In various embodiments, the processing device 702 may include one or more digital signal processors (DSPs), application-specific integrated circuits (ASICs), central processing units (CPUs), graphics processing units (GPUs), server processors, or any other suitable processing devices.

The computing device 700 also includes a storage device 704 (e.g., one or more storage devices). In various embodiments, the storage device 704 may include one or more memory devices, such as random-access memory (RAM) devices (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 704 may include memory that shares a die with the processing device 702. In such an embodiment, the memory may be used as cache memory and include embedded dynamic random-access memory (eDRAM) or spin transfer torque magnetic random-access memory (STT-MRAM), for example. In some embodiments, the storage device 704 may include non-transitory computer readable media having instructions thereon that, when executed by one or more processing devices (e.g., the processing device 702), cause the computing device 700 to perform any appropriate ones of the methods disclosed herein below or portions of such methods.

The computing device 700 further includes an interface device 706 (e.g., one or more interface devices 706). In various embodiments, the interface device 706 may include one or more communication chips, connectors, and/or other hardware and software to govern communications between the computing device 700 and other computing devices. For example, the interface device 706 may include circuitry for managing wireless communications for the transfer of data to and from the computing device 700. The term "wireless" and its derivatives may be used to describe circuits, devices, systems, methods, techniques, communications channels, etc., that may communicate data via modulated electromagnetic radiation through a nonsolid medium. The term does not imply that the associated devices do not contain any wires, although in some embodiments they might not. Circuitry included in the interface device 706 for managing wireless communications may implement any of a number of wireless standards or protocols, including but not limited to Institute for Electrical and Electronic Engineers (IEEE) standards including Wi-Fi (IEEE 802.11 family), IEEE 802.16 standards, Long-Term Evolution (LTE) project along with any amendments, updates, and/or revisions (e.g., advanced LTE project, ultramobile broadband (UMB) project (also referred to as "3GPP2"), etc.). In some embodiments, circuitry included in the interface device 706 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 706 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 706 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 706 may include one or more antennas (e.g., one or more antenna arrays) configured to receive and/or transmit wireless signals.

In some embodiments, the interface device 706 may include circuitry for managing wired communications, such as electrical, optical, or any other suitable communication protocols. For example, the interface device 706 may include circuitry to support communications in accordance with Ethernet technologies. In some embodiments, the interface device 706 may support both wireless and wired communication, and/or may support multiple wired communication protocols and/or multiple wireless communication protocols. For example, a first set of circuitry of the interface device 706 may be dedicated to shorter-range wireless communications such as Wi-Fi or Bluetooth, and a second set of circuitry of the interface device 706 may be dedicated to longer-range wireless communications such as global positioning system (GPS), EDGE, GPRS, CDMA, WiMAX, LTE, EV-DO, or others. In some other embodiments, a first set of circuitry of the interface device 706 may be dedicated to wireless communications, and a second set of circuitry of the interface device 706 may be dedicated to wired communications.

The computing device 700 also includes battery/power circuitry 708. In various embodiments, the battery/power circuitry 708 may include one or more energy storage devices (e.g., batteries or capacitors) and/or circuitry for coupling components of the computing device 700 to an energy source separate from the computing device 700 (e.g., to AC line power).

The computing device 700 also includes a display device 710 (e.g., one or multiple individual display devices). In various embodiments, the display device 710 may include any visual indicators, such as a heads-up display, a computer monitor, a projector, a touchscreen display, a liquid crystal display (LCD), a light-emitting diode display, or a flat panel display.

The computing device 700 also includes additional input/output (I/O) devices 712. In various embodiments, the I/O devices 712 may include one or more data/signal transfer interfaces, audio I/O devices (e.g., microphones or microphone arrays, speakers, headsets, earbuds, alarms, etc.), audio codecs, video codecs, printers, sensors (e.g., thermocouples or other temperature sensors, humidity sensors, pressure sensors, vibration sensors, etc.), image capture devices (e.g., one or more cameras), human interface devices (e.g., keyboards, cursor control devices, such as a mouse, a stylus, a trackball, or a touchpad), etc.

Depending on the specific embodiment of the scientific instrument 100 and/or of the instrument portion 200, various components of the interface devices 706 and/or I/O devices 712 can be configured to output suitable control signals (e.g., 152, 154, 156, 408) for various components of the scientific instrument 100, receive suitable control/telemetry signals from various components of the scientific instrument 100, and receive streams of measurements (e.g., 162, 172, 182) from various detectors of the scientific instrument 100. In some examples, the interface devices 706 and/or I/O devices 712 include one or more analog-to-digital converters (ADCs) for transforming received analog signals into a digital form suitable for operations performed by the processing device 702 and/or the storage device 704. In some additional examples, the interface devices 706 and/or I/O devices 712 include one or more digital-to-analog converters (DACs) for transforming digital signals provided by the processing device 702 and/or the storage device 704 into an analog form suitable for being communicated to the corresponding components of the scientific instrument 100.

According to one example disclosed above, e.g., in the summary section and/or in reference to any one or any combination of some or all of FIGS. 1-7, provided is a scientific instrument, comprising: an electron-beam column configured to scan an electron beam across a sample, the electron-beam column including a beam blanker configured to gate the electron beam in response to a binary drive signal having first and second levels selected to cause the beam blanker to pass the electron beam therethrough toward the sample when the binary drive signal is at the first level and to block the electron beam when the binary drive signal is at the second level; an electron detector configured to measure a flux of transmitted scattered electrons produced by interaction of the electron beam with the sample; and an electronic controller configured to: acquire an image of the sample using values of the flux measured for a plurality of electron-beam scan locations; and cause the binary drive signal to have a gating frequency at which the image has a moiré pattern therein.

In some examples of the above scientific instrument, the scientific instrument further comprises: a driver circuit configured to generate the binary drive signal in response to a gating signal and further configured to apply the binary drive signal to the beam blanker; and a waveform generator configured to generate the gating signal in response to a control signal received from the electronic controller, the control signal specifying a set of parameter values for the gating signal including the gating frequency.

In some examples of any of the above scientific instruments, the set of parameter values further includes a value of a duty cycle for the gating signal.

In some examples of any of the above scientific instruments, the set of parameter values includes an increment value for changing the gating frequency.

In some examples of any of the above scientific instruments, the set of parameter values includes signal-synchronization information for the gating signal relative to a scan signal used to operate a scan coil of the electron-beam column during the scan.

In some examples of any of the above scientific instruments, the scan signal includes a staircase waveform.

In some examples of any of the above scientific instruments, the scan signal is configured to implement a dwell time smaller than 2 μs/pixel (or smaller than 1 μs/pixel, or smaller than 5 μs/pixel, or smaller than 10 μs/pixel).

In some examples of any of the above scientific instruments, the beam blanker includes an electrostatic beam deflector.

In some examples of any of the above scientific instruments, the electron detector is selected from the group consisting of: a high-angle annular dark field detector; a medium-angle annular dark field detector; an annular bright field detector; a segmented annular detector; a secondary electron detector; a backscattered electron detector; a differential phase contrast detector; an electron energy loss spectroscopy detector; an energy-dispersive X-ray spectroscopy detector; and a two-dimensional pixelated or segmented electron detector.

In some examples of any of the above scientific instruments, the electronic controller is configured to generate a strain map of the sample based on the moiré pattern.

In some examples of any of the above scientific instruments, the electronic controller is configured to tune the electron-beam column based on the moiré pattern to cause a focused portion of the electron beam to be at the sample.

In some examples of any of the above scientific instruments, the electronic controller is configured to implement a sweep of the gating frequency while a sampling frequency of the scan remains fixed.

According to another example disclosed above, e.g., in the summary section and/or in reference to any one or any combination of some or all of FIGS. 1-7, provided is a moiré imaging method, comprising: scanning an electron beam across a sample with an electron-beam column including a beam blanker configured to gate the electron beam in response to a binary drive signal having first and second levels selected to cause the beam blanker to pass the electron beam therethrough toward the sample when the binary drive signal is at the first level and to block the electron beam when the binary drive signal is at the second level; measuring, with an electron detector, a flux of transmitted scattered electrons produced by interaction of the electron beam with the sample; acquiring, with an electronic controller, an image of the sample using values of the flux measured for a plurality of electron-beam scan locations; and causing, with the electronic controller, the binary drive signal to have a gating frequency at which the image has a moiré pattern therein.

In some examples of the above moiré imaging method, the moiré imaging method further comprises: generating the binary drive signal in response to a gating signal; and generating the gating signal in response to a control signal received from the electronic controller, the control signal specifying a set of parameter values for the gating signal including the gating frequency.

In some examples of any of the above moiré imaging methods, the set of parameter values further includes one or more of: a value of a duty cycle for the gating signal; an increment value for changing the gating frequency; and signal-synchronization information for the gating signal relative to a scan signal used to operate a scan coil of the electron-beam column during the scan.

In some examples of any of the above moiré imaging methods, the scan signal includes a staircase waveform.

In some examples of any of the above moiré imaging methods, the scan signal is configured to implement a dwell time smaller than 2 μs/pixel (or smaller than 1 μs/pixel, or smaller than 5 μs/pixel, or smaller than 10 μs/pixel).

In some examples of any of the above moiré imaging methods, the moiré imaging method further comprises generating a strain map of the sample based on the moiré pattern.

In some examples of any of the above moiré imaging methods, the moiré imaging method further comprises tuning the electron-beam column based on the moiré pattern to cause a focused portion of the electron beam to be at the sample.

In some examples of any of the above moiré imaging methods, the moiré imaging method further comprises sweeping the gating frequency while a sampling frequency of the scan remains fixed.

In some examples of any of the above moiré imaging methods, the method further comprises one or more of: (i) sweeping the gating frequency until an approximately maximum moiré-fringe contrast is realized for a region of interest (ROI) or for a reference area of the sample; (ii) performing a full scan of the ROI at the determined gating frequency to ensure a high moiré-fringe contrast in a complementary scan direction; and (iii) performing another frequency sweep and/or another full scan with a fast scan direction and a slow scan direction interchanged.

In some examples of any of the above moiré imaging methods, the reference area is an area of the sample where a substantially zero strain is expected.

In some examples of any of the above moiré imaging methods, the method further comprises repeating one or more of the full scans with a different respective gating frequency.

In some examples of any of the above moiré imaging methods, the method further comprises resolving a sign ambiguity in the strain map based on the one or more repeated full scans.

It is to be understood that the above description is intended to be illustrative and not restrictive. Many implementations and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future examples. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed subject matter incorporate more features than are expressly recited in each claim. Rather, as the following claims reflect, inventive subject matter lies in fewer than all features of a single disclosed example. Thus, the following claims are hereby incorporated into the Detailed Description, with each claim standing on its own as a separately claimed subject matter.

Unless explicitly stated otherwise, each numerical value and range should be interpreted as being approximate as if the word "about" or "approximately" preceded the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the terms "circuit," "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A scientific instrument, comprising:
an electron-beam column configured to scan an electron beam across a sample, the electron-beam column including a beam blanker configured to gate the electron beam in response to a drive signal;
an electron detector configured to measure a flux of transmitted or scattered electrons having interacted with the sample; and
an electronic controller configured to:
acquire an image of the sample using values of the flux measured with the electron detector for a plurality of electron-beam scan locations; and
cause the drive signal to have a gating frequency at which the image has a moiré pattern therein.
2. The scientific instrument of claim 1, further comprising:
a driver circuit configured to generate the drive signal in response to a gating signal and further configured to apply the drive signal to the beam blanker; and
a waveform generator configured to generate the gating signal in response to a control signal received from the electronic controller, the control signal specifying a set of parameter values for the gating signal including the gating frequency.
3. The scientific instrument of claim 2, wherein the set of parameter values further includes a value of a duty cycle for the gating signal.
4. The scientific instrument of claim 2, wherein the set of parameter values includes an increment value for changing the gating frequency.
5. The scientific instrument of claim 2, wherein the set of parameter values includes signal-synchronization information for the gating signal relative to a scan signal used to operate a scan coil of the electron-beam column during the scan.
6. The scientific instrument of claim 5, wherein the scan signal includes a staircase waveform.
7. The scientific instrument of claim 5, wherein the scan signal is configured to implement a dwell time smaller than 2 µs/pixel.
8. The scientific instrument of claim 1, wherein the beam blanker includes an electrostatic beam deflector.
9. The scientific instrument of claim 1, wherein the electron detector is selected from the group consisting of:
a high-angle annular dark field detector;
a medium-angle annular dark field detector;
an annular bright field detector;
a segmented annular detector;
a differential phase contrast detector;
a secondary electron detector;
a backscattered electron detector;
an electron energy loss spectroscopy detector;
an energy-dispersive X-ray spectroscopy detector; and
a two-dimensional pixelated or segmented electron detector.
10. The scientific instrument of claim 1, wherein the electronic controller is configured to generate a strain map of the sample based on the moiré pattern.
11. The scientific instrument of claim 1, wherein the electronic controller is configured to tune the electron-beam column based on the moiré pattern to cause a focused portion of the electron beam to be at the sample.
12. The scientific instrument of claim 1, wherein the electronic controller is configured to implement a sweep of the gating frequency while a sampling frequency of the scan remains fixed.
13. A moiré imaging method, comprising:
scanning an electron beam across a sample with an electron-beam column including a beam blanker configured to gate the electron beam in response to a drive signal;
measuring, with an electron detector, a flux of transmitted or scattered electrons having interacted with the sample;
acquiring, with an electronic controller, an image of the sample using values of the measured flux for a plurality of electron-beam scan locations; and
causing, with the electronic controller, the drive signal to have a gating frequency at which the image has a moiré pattern therein.
14. The moiré imaging method of claim 13, further comprising:
generating the drive signal in response to a gating signal; and
generating the gating signal in response to a control signal received from the electronic controller, the control signal specifying a set of parameter values for the gating signal including the gating frequency.

15. The moiré imaging method of claim 14, wherein the set of parameter values further includes one or more of:

a value of a duty cycle for the gating signal;

an increment value for changing the gating frequency; and signal-synchronization information for the gating signal relative to a scan signal used to operate a scan coil of the electron-beam column during the scan.

16. The moiré imaging method of claim 15, wherein the scan signal includes a staircase waveform.

17. The moiré imaging method of claim 15, wherein the scan signal is configured to implement a dwell time smaller than 5 µs/pixel.

18. The moiré imaging method of claim 13, further comprising generating a strain map of the sample based on the moiré pattern.

19. The moiré imaging method of claim 13, further comprising tuning the electron-beam column based on the moiré pattern to cause a focused portion of the electron beam to be at the sample.

20. The moiré imaging method of claim 13, further comprising sweeping the gating frequency while a sampling frequency of the scan remains fixed.

\* \* \* \* \*